US006172294B1

United States Patent
Tsuno et al.

(10) Patent No.: US 6,172,294 B1
(45) Date of Patent: Jan. 9, 2001

(54) THERMOELECTRIC SEMICONDUCTOR HAVING A SINTERED SEMICONDUCTOR LAYER AND FABRICATION PROCESS THEREOF

(75) Inventors: Katsuhiro Tsuno, Tokyo; Tsuyoshi Tosho, Noboribetsu; Hideo Watanabe, Kawasaki, all of (JP)

(73) Assignees: Technova Inc.; Engineering Advancement Association of Japan, both of Tokyo (JP)

( * ) Notice: Under 35 U.S.C. 154(b), the term of this patent shall be extended for 0 days.

(21) Appl. No.: 09/289,063

(22) Filed: Apr. 12, 1999

Related U.S. Application Data (62) Division of application No. 08/901,791, filed on Jul. 28, 1997, now Pat. No. 5,959,341.

(30) Foreign Application Priority Data

Jul. 26, 1996 (JP) ................................................ 8-197790

(51) Int. Cl.[7] .................................................. H01L 35/08
(52) U.S. Cl. ........................ 136/201; 136/203; 136/205; 252/62.3 T
(58) Field of Search ................... 136/201, 203, 136/205; 252/62.3 T (56) References Cited

U.S. PATENT DOCUMENTS

| 3,086,068 | * | 4/1963 | Charland et al. | 136/5 |
|---|---|---|---|---|
| 4,855,810 | * | 8/1989 | Gelb et al. | 257/712 |
| 5,108,515 | * | 4/1992 | Ohta et al. | 136/201 |
| 5,409,547 | * | 4/1995 | Watanabe et al. | 136/204 |
| 5,429,680 | * | 7/1995 | Fuschetti | 136/203 |
| 5,439,528 | * | 8/1995 | Miller | 257/467 |
| 5,441,576 | * | 8/1995 | Bierschenk et al. | 136/203 |
| 5,763,293 | * | 6/1998 | Yamanishi et al. | 438/55 |
| 5,817,188 | * | 10/1998 | Yahatz et al. | 136/203 |
| 5,912,429 | * | 6/1999 | Imanishi et al. | 136/240 |
| 5,969,290 | * | 10/1999 | Kagawa et al. | 136/201 |
| 5,981,863 | * | 11/1999 | Yamashita et al. | 136/201 |
| 6,025,554 | * | 2/2000 | Macris | 136/205 |

* cited by examiner

Primary Examiner—Kathryn Gorgos
Assistant Examiner—Thomas H Parsons
(74) Attorney, Agent, or Firm—Evenson, McKeown, Edwards & Lenahan, P.L.L.C.

(57) ABSTRACT

A thermoelectric semiconductor is formed of a sintered semiconductor layer and metal layers arranged on sides of opposite end faces of the sintered semiconductor layer. These metal layers are to inhibit a reaction between the sintered semiconductor layer and solder layers through which electrodes are joined to the sintered semiconductor layer. The sintered semiconductor layer and the metal layers have been obtained beforehand by integrally sintering a semiconductor powder layer and metal sheets arranged on sides of opposite end faces of the semiconductor powder layer.

3 Claims, 8 Drawing Sheets

THERMOELECTRIC SEMICONDUCTOR HAVING A SINTERED SEMICONDUCTOR LAYER AND FABRICATION PROCESS THEREOF

This application is a division of application Ser. No. 08/901,791, filed Jul. 28, 1997 (now U.S. Pat. No. 5,959, 341) issued Sep. 28, 1998.

BACKGROUND OF THE INVENTION a) Field of the Invention

This invention relates to thermoelectric semiconductors useful, for example, in a thermoelectric cooling device or an electricity generating device and also to a fabrication process thereof. In particular, the present invention is concerned with thermoelectric semiconductors formed of sintered compacts and also with a fabrication process of the thermoelectric semiconductors.

b) Description of the Related Art

For use as thermoelectric semiconductors in a thermoelectric cooling device or the like, a $Bi_2Te_3$ system material grown in the form of a crystal is machined and processed. These machining and processing procedures include slicing a $Bi_2Te_3$ system, thermoelectric semiconductor crystal in thicknesses of that of an intended device to obtain wafer-shaped thermoelectric semiconductors and then etching surfaces of the wafer-shaped thermoelectric semiconductors. This etching treatment is applied to remove finely-cracked surface layers formed upon slicing and processing-modified layers of oxides or the like and also to obtain sufficient bonding strength with associated Ni-plating layers to be described subsequently herein. Each wafer-shaped thermoelectric semiconductor is diced into individual semiconductor chips. Each semiconductor chip is then joined to electrodes with a low melt solder such as a Pb—Sn eutectic alloy.

As another process, each wafer-shaped thermoelectric semiconductor of the above-described type is roughened at surfaces thereof by treatment such as sandblasting, and Ni powder is thermally sprayed onto the surfaces. Subsequent to polishing the surfaces, the wafer-shaped thermoelectric semiconductor is diced into individual semiconductor chips, to which electrodes are then joined with a solder.

The former process has a low processing yield because a semiconductor crystal has low mechanical strength, and also requires a long time for the production of semiconductor crystals. The former process therefore leads to high fabrication cost. The latter process, on the other hand, is also accompanied by similar problems in mechanical strength and fabrication cost. In addition, a processing-modified layer is formed on each semiconductor layer and moreover, a thermally-sprayed Ni layer is not dense and oxides or impurities are contained in a joined interface, thereby resulting in a reduction in characteristics.

With a view to reducing the fabrication cost, fabrication processes of thermoelectric semiconductors by powder sintering are now under investigation. According to these processes, a powder mix of semiconductor raw materials is sintered into a block of 40 mm×30 mm×30 mm or so. The block is sliced in thicknesses of that of each intended semiconductor chip, whereby wafer-shaped thermoelectric semiconductors are obtained. Each wafer-shaped thermoelectric semiconductor is subjected at surfaces thereof to etching treatment and plating treatment and is then diced into individual semiconductor chips. Each semiconductor chip is joined to electrodes with a solder.

However, these conventional powder sintering processes are each accompanied by the drawback that sintered grain boundaries are damaged by etching treatment, the bonding strength available with electrodes is not so high as that available in the case of a crystal even if Ni-plating is applied, and the resultant thermoelectric semiconductor hence has low reliability.

In the meantime, still further processes have been proposed in each of which, after a wafer-shaped thermoelectric semiconductor is subjected at surfaces thereof to etching treatment and is machined and processed into semiconductor chips, each of the chips is directly joined to electrodes with a special Pb—Sn system solder [reference may be had, for example, to "Netsuden Henkan Shisutemu Gijyutsu Souran (Comprehensive Bibliography of Technologies on Thermoelectric Conversion Systems)", pages 24–28, The Realize Co., Ltd.]. A Pb—Sn system solder however involves the problem that its reaction with a semiconductor material tends to proceed during use and the characteristics of the semiconductor are progressively lowered in the course of use.

SUMMARY OF THE INVENTION

A first object of the present invention is therefore to eliminate the above-described drawbacks or problems of the conventional art and to provide a thermoelectric semiconductor having excellent characteristics and reliability.

A second object of the present invention is to provide a fabrication process for such a thermoelectric semiconductor.

To achieve the first object, the present invention provides a thermoelectric semiconductor characterized in that said thermoelectric semiconductor comprises:

a sintered semiconductor layer, metal layers, for example, of copper, aluminum or the like arranged on sides of opposite end faces of said sintered semiconductor layer to inhibit a reaction between an electrode-joining material, such as solder, and said sintered semiconductor layer subsequent to assembly of said thermoelectric semiconductor, and electrodes joined with said electrode-joining material to said sintered semiconductor layer via said metal layers, respectively;

wherein said sintered semiconductor layer and said metal layers have been obtained by integrally sintering a semiconductor powder layer, for example, of the Bi—Te system and metal sheets arranged on sides of opposite end faces of said semiconductor powder layer where said sintered semiconductor layer resulting from said semiconductor powder layer subsequent to said sintering is located opposite said electrodes.

To attain the second object, the present invention provides a process for the fabrication of a thermoelectric semiconductor, which comprises the following steps:

quenching a molten semiconductor material, for example, of the Bi—Te system to obtain plate-shaped small semiconductor particles;

filling said semiconductor particles between metal sheets, for example, of copper, aluminum or the like which subsequent to assembly of said thermoelectric semiconductor, serves to inhibit a reaction between an electrode-joining material, such as a solder, and a sintered semiconductor layer to be formed by sintering said semiconductor particles;

compressing said semiconductor particles in a direction perpendicular to said metal sheets so that a semiconductor powder layer is formed between said metal sheets;

sintering said semiconductor powder layer and said metal sheets integrally, thereby obtaining said sintered semiconductor layer with metal layers joined thereto on sides of opposite end faces thereof, respectively; and joining, with said electrode-joining material, said sintered semiconductor layer to electrodes via said metal layers, respectively.

DETAILED DESCRIPTION OF THE INVENTION AND PREFERRED EMBODIMENTS

According to the present invention, a metal layer is interposed between a sintered layer of a semiconductor material and each electrode-joining material as described above. It is therefore possible to inhibit a reaction between the semiconductor material and the electrode-joining material and accordingly to avoid a reduction in characteristics.

The sintered layer of the semiconductor material has been integrally sintered with the metal layer so that a good joining state has been established therebetween. Moreover, the semiconductor has extremely high mechanical strength owing to the powder sintering, thereby making it possible to achieve an improvement in reliability.

Opposite end faces of the sintered semiconductor layer, where the sintered semiconductor layer is joined to electrodes, are covered and protected by the metal layers, and are joined to the electrodes via the corresponding metal layers without cutting out a semiconductor layer or being subjected to blast treatment. No processing-modified layer is therefore formed on the sintered semiconductor layer so that no reduction takes place in characteristics.

Further, when a molten semiconductor material is quenched, small plate-shaped semiconductor particles are formed by way of a ribbon or the like and the semiconductor particles are filled between metal sheets, most of the semiconductor particles are necessarily brought into a state where they are stacked one over the other in layers. Most of the semiconductor particles are therefore oriented with their a-axes directed in a direction perpendicular to the metal sheets, that is, towards the electrodes (namely, in a direction of a current fed across the semiconductor layer), whereby a semiconductor layer having a high figure of merit (Z) can be obtained.

Figure 2:
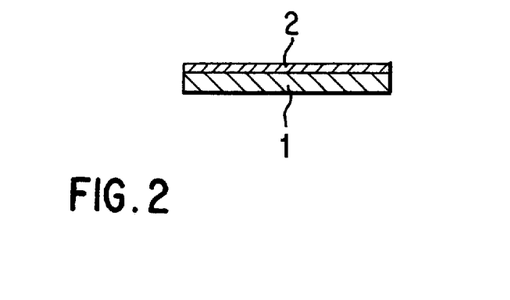
FIG. 2 is a cross-sectional view of one of metal sheets employed upon fabrication of the thermoelectric semiconductor.

As is shown in FIG. 2, a surface treatment layer 2 of a material—which does not substantially lower the characteristics of the semiconductor even when reacted with the semiconductor, for example, nickel or the like—is formed to a thickness of 20 $\mu$m or smaller, for example, in a range of from 5 to 10 $\mu$m on a surface of a metal sheet 1 having a thickness of 100 to 300 $\mu$m and composed of copper, aluminum or the like by a suitable thin-film forming process such as plating, sputtering or vacuum evaporation. Although the surface treatment layer 2 was formed on one side of the metal sheet 1 in this embodiments, such surface treatment layers can preferably be formed on both sides of the metal sheet 1.

Figure 3:
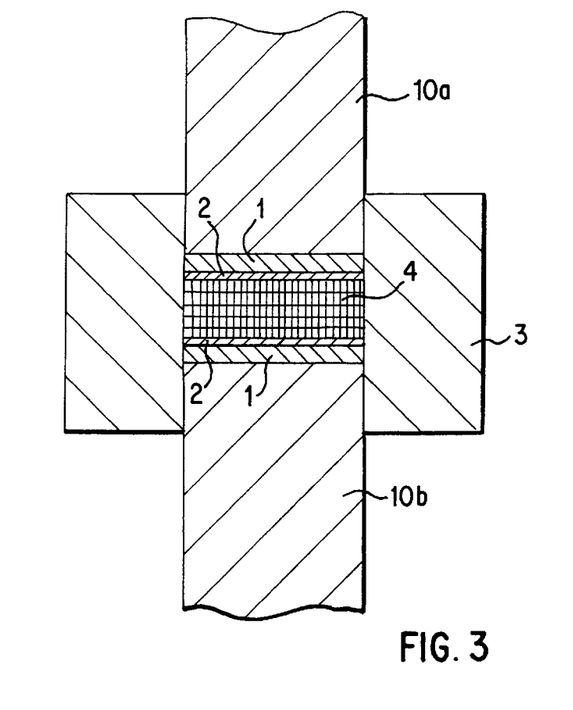
FIG. 3 is a cross-sectional view of a die with metal sheets and a layer of semiconductor power filled therein, illustrating a sintering method for the thermoelectric semiconductor.

As is illustrated in FIG. 3, two metal sheets 1,1 prepared as described above are arranged within a sintering die 3 so that the surface treatment layers 2 are located on inner sides. A layer 4 of plate-shaped semiconductor particles prepared by the quenching process (hereinafter called "the semiconductor powder layer 4") is arranged between the two metal sheets 1,1.

Illustrative examples of the material usable for the formation of the thermoelectric semiconductor in the present invention include a wide variety of semiconductor materials such as bismuth (Bi)-tellurium (Te) system semiconductor materials, antimony(Sb)-tellurium (Te) system semiconductor materials, lead (Pb)-tellurium (Te) system semiconductor materials, and bismuth (Bi)-antimony (Sb) system semiconductor materials. Described specifically, Bi—Te, Bi—Sb—Te, Bi—Sb—Te—Se, Bi—Te—Se, Bi—Sb and the like are applicable.

In this embodiment, $(Bi_2Te_3)_x(Sb_2Te_3)1-x$ (x: a value in a range of from 0.20 to 0.30) with Se, Te or the like added as a dopant can be used as p-type semiconductor. As an n-type semiconductor, a ternary alloy of $(Bi_2Te_3)y(Bi_2Se_3)$ 1−y (y: a value of from 0.75 to 0.95) or an alloy system obtained by adding $(Sb_2Se_3)$ to the ternary alloy, said ternary alloy or alloy system containing a halogenide dopant, for example, $SbI_3$ added as a dopant thereto, can be used.

Figure 4:
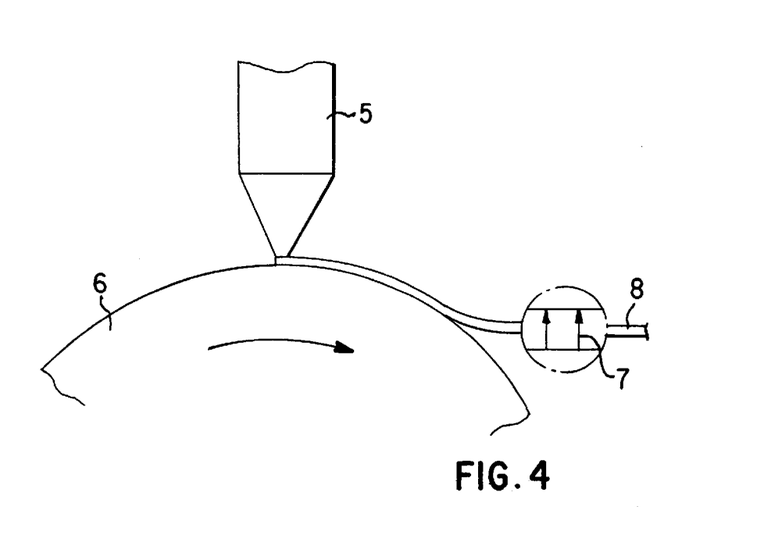
FIG. 4 is a schematic construction diagram for illustrating a quenching process for the semiconductor powder.

As is shown in FIG. 4, a melt of such a semiconductor material is sprayed from a nozzle 5 onto a cooling drum 6 rotating at a high speed, so that the melt is promptly cooled. The molten semiconductor material is cooled and solidified in the direction of the thickness of the resulting layer, whereby crystals are also allowed to grow in the direction of the thickness of the layer. A thin ribbon 8 is therefore obtained with a structure in which crystals have a-axes (crystallographic axes) 7 extending in directions of arrows and are aligned in the direction of the thickness of the layer.

In this embodiment, the melting method for the semiconductor material was induction heating, the diameter of the nozzle 5 was 0.5 mm, the spray pressure was 0.2 kg f/cm$^2$, the material, rotation speed and peripheral speed of the cooling drum 6 were copper, 1,000 rpm and about 16 m/min, respectively, the clearance between the nozzle 5 and the cooling drum 6 was 1 mm, and the atmosphere was an inert atmosphere such as argon.

Figure 5:
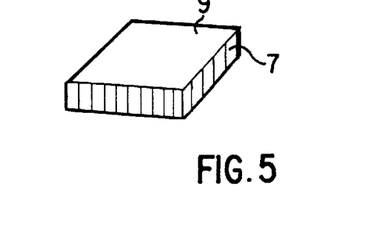
FIG. 5 is an enlarged concept diagram of one of plate-shaped semiconductor particles produced by the quenching process.
Figure 6:
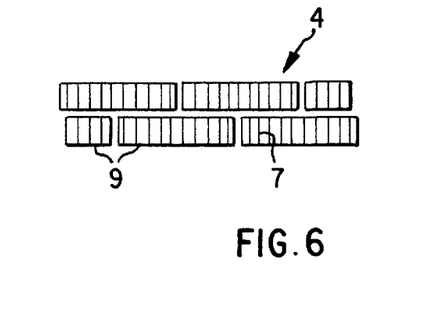
FIG. 6 is an enlarged concept diagram for illustrating a filled state of some of the plate-shaped semiconductor particles within the die.

Since the ribbon 8 has strong cleavage, the ribbon 8 readily breaks into small plate-shaped particles 9 as shown in FIG. 5. As is shown schematically in FIG. 6, these plate-shaped particles 9 are stacked one over the other substantially in layers within the die 3 so that the semiconductor powder layer 4 is formed. As they have substantially the same shape, the semiconductor powder layer 4 has a high packing density.

Figure 7:
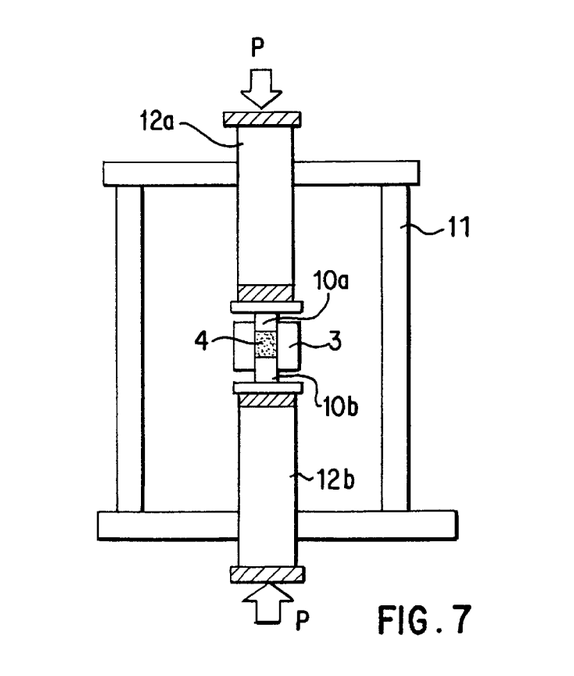
FIG. 7 is a partly-simplified construction diagram of a plasma sintering furnace for integrally sintering the metal sheets and the layer of semiconductor powder together.

As is illustrated in FIG. 3, the metal sheets 1,1 and the semiconductor powder layer 4, which are placed within the die 3, are arranged between an upper and lower plungers 10a, 10b. They are disposed within a water-cooled vacuum chamber 11 as shown in FIG. 7, and predetermined pressing force is applied in the stacked direction of the plate-shaped particles 9 by an unillustrated pressure mechanism.

At the same time, a pulsating current is fed across an upper electrode 12a connected to the upper plunger 10a and a lower electrode 12b connected to the lower plunger 10b from a sintering d.c. power supply (not shown), whereby Joule heat is produced between the respective plate-shaped particles 9 to effect sintering between the plate-shaped particles 9. Incidentally, the die 3 and the upper and lower plungers 10a, 10b are constructed of an electrical conductor such as graphite, a super-hard alloy, iron or steel.

Across the plate-shaped particles 9 maintained under pressure (100 to 5,000 kg/cm$^2$) between the upper and lower plungers 10a, 10b, an ON-OFF d.c. pulsating voltage (cycle: 300 Hz to 302 KHz) produced using the sintering d.c. power supply is applied for 1 to 15 minutes. Owing to high energy of electric discharges and Joule heat instantaneously produced by the application of the pulsating voltage, the temperature promptly rises between the particles, followed by the quenching of the resulting particle-bonding portions as a result of thermal diffusion. As the application of a pulsating voltage makes it possible to control application energy while observing the progress of such sintering, excellent sintering controllability is available, in other words, a sintered microstructure low in the growth of grains can be easily obtained under control.

By the application of a voltage through such repetitions of ON-OFF, discharge points (points of occurrence of localized high temperatures) within the compressed semiconductor powder layer 4 spread throughout the semiconductor powder layer while successively moving from points to points. It is therefore possible to obtain a sintered compact of uniform quality.

Moreover, ions are caused to move at high speeds under the action of an electric field upon application of a pulsating current. Removal of oxides and adsorbed gas from the semiconductor powder layer 4 can therefore be effectively performed, thereby making it possible to obtain a sintered compact of high quality.

Figure 1:
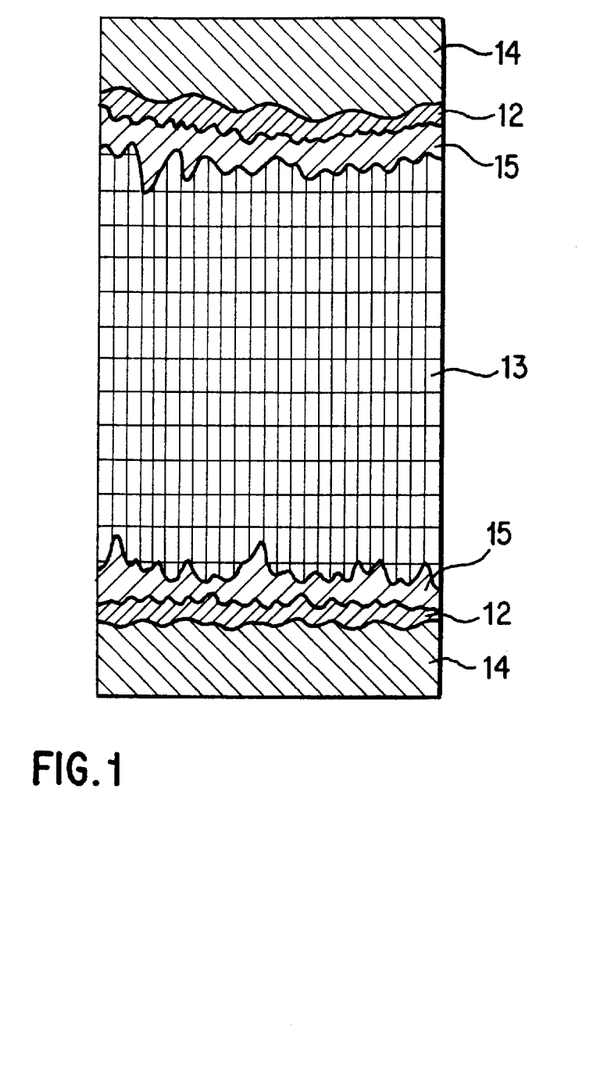
FIG. 1 is a cross-sectional view of a thermoelectric semiconductor according to one embodiment of the present invention.

The cross-sectional view of FIG. 1 schematically illustrates a sintered compact obtained as described above. On sides of an upper and lower end faces of a sintered semiconductor layer 13 of about 1.6 mm in average thickness with most a-axes (crystallographic axes) aligned in the direction of the thickness of the sintered mass, metal layers 14,14 made of copper or aluminum and having an average thickness of from about 0.2 to 0.3 mm are formed. On inner sides of the metal layers 14,14, surface treatment layers 12,12 made of nickel and having an average thickness of from about 0.001 to 0.01 mm are arranged, respectively. Further, reacted layers 15,15 of about 0.04 mm (40 µm) or less in average thickness are formed on inner sides of the surface treatment layers 12,12, respectively. These layers are integrally joined together.

Figure 8:
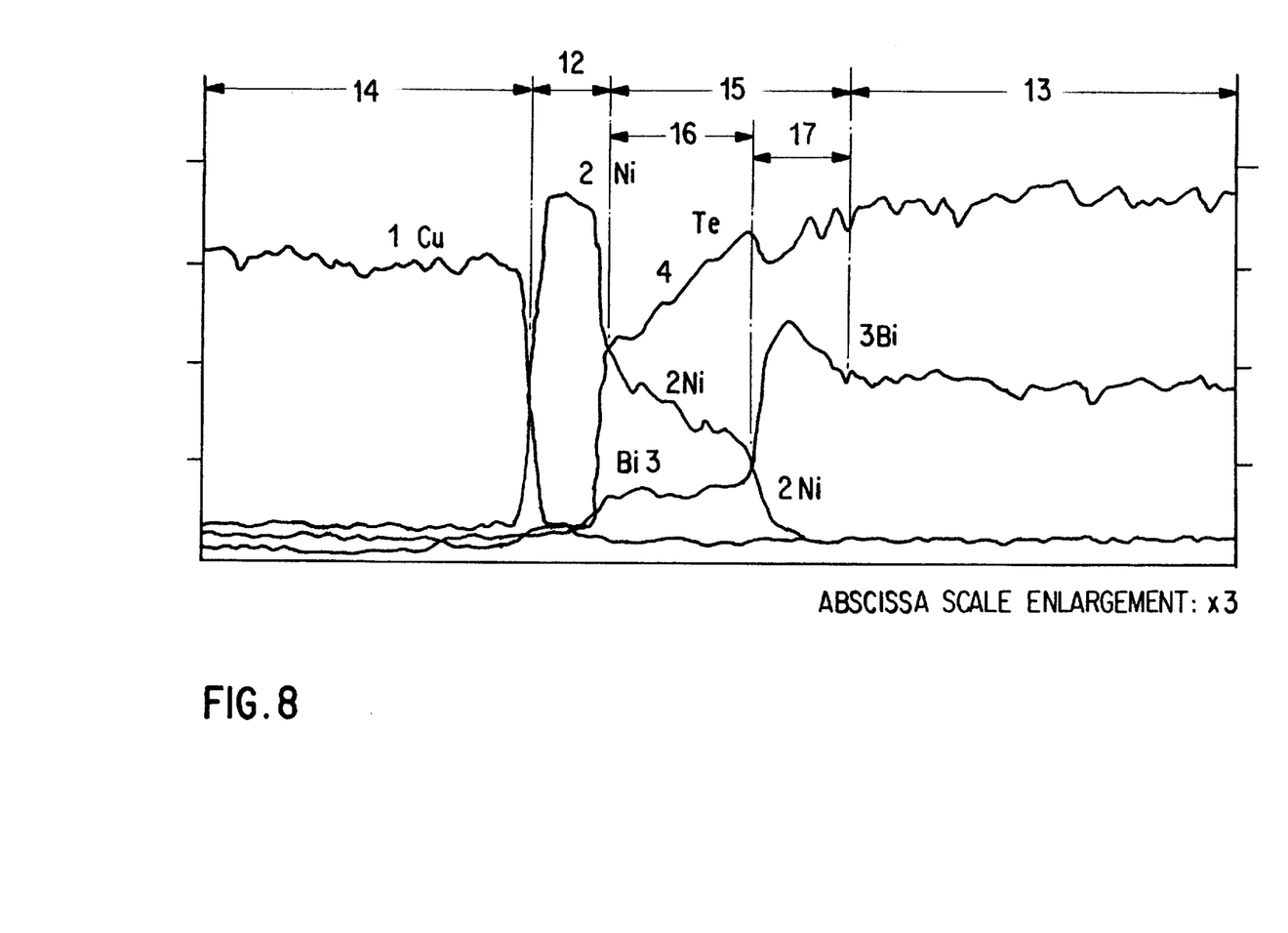
FIG. 8 is a characteristic diagram illustrating the results of a line analysis of a p-type, Bi—Te system, sintered compact according to another embodiment of the present invention by an EDX (energy-dispersive x-ray) spectrometer.
Figure 9:
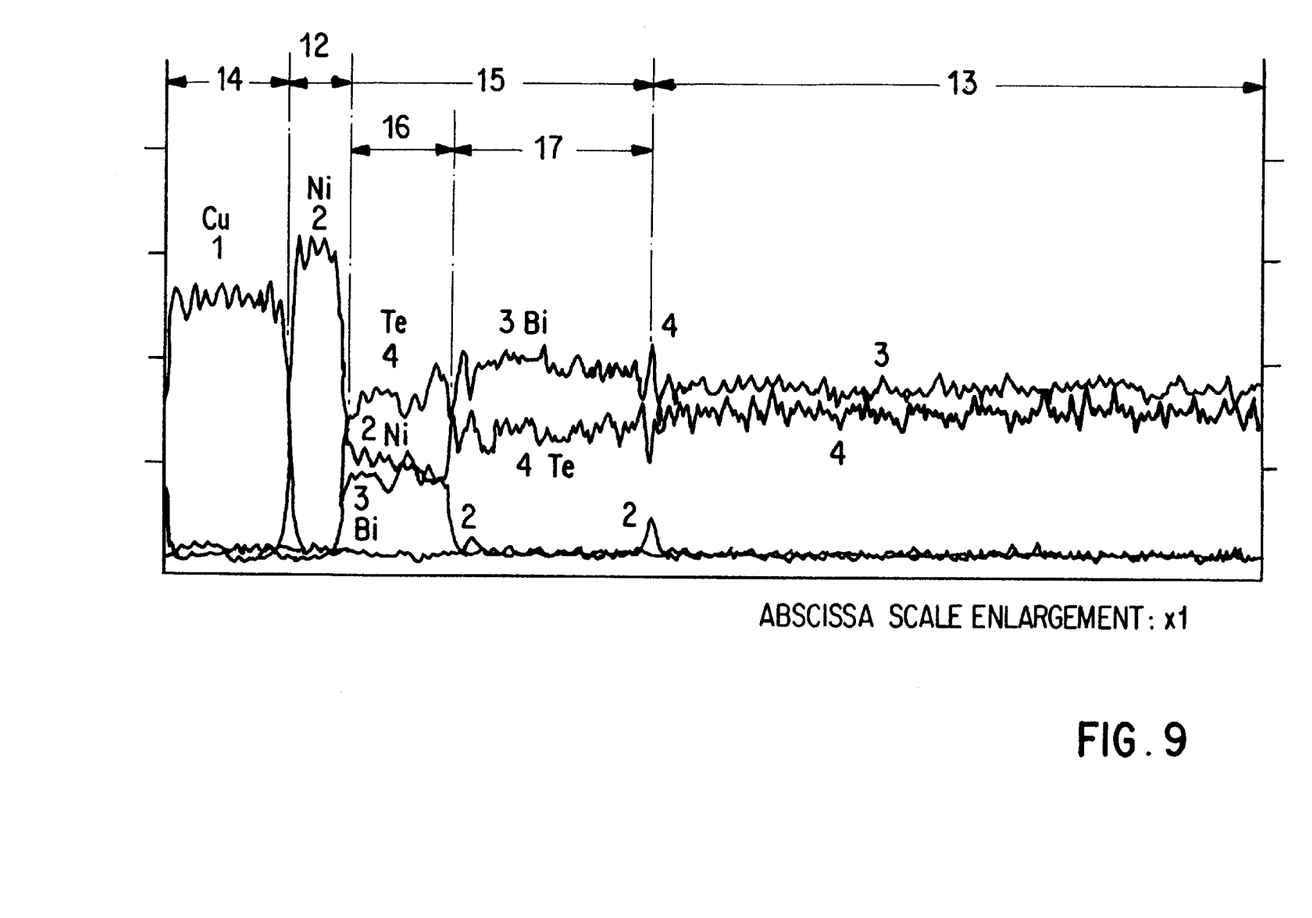
FIG. 9 is a characteristic diagram illustrating the results of a line analysis of an n-type, Bi—Te system, sintered compact according to a further embodiment of the present invention by the EDX spectrometer.

The characteristic diagrams of FIGS. 8 and 9 illustrate the results of the line analyses of the p-type, Bi—Te system, sintered compact and the n-type, Bi—Te system, sintered compact by EDX. They show the analysis results of individual elements—Cu, Ni, Bi and Te—as analyzed at an acceleration voltage of 20 KV while using, as measuring instruments, "FE4200" [trade name; SEM (scanning electron microscope) manufactured by Hitachi, Ltd.] and "EMAX5770XR" [trade name; EDX spectrometer manufactured by Horiba Ltd.].

In each diagram, there are shown the metal layer 14 composed of Cu the surface treatment layer 12 composed of Ni and the reacted layer 15. The reacted layer 15 is in turn formed of a diffusion-joined layer 16, which is composed of Ni and Te, and a Bi-rich layer 17. As is apparent from both of the diagrams, it is clearly confirmed that the reacted layer 15 composed of the diffusion-joined layer 16 and the Bi-rich layer 17 is formed between the surface treatment layer 12 and the sintered semiconductor layer 13. Concerning the mechanism of formation of this Bi-rich layer 17, it is considered that Te, which had inherently existed there, diffused toward the diffusion-joined layer 16 and the concentration of Te was hence lowered, resulting in the formation of the layer 17 with a relatively high Bi concentration. Incidentally, the boundary between the diffusion-joined layer 16 and the Bi-rich layer 17 is not defined well necessarily.

Figure 10:
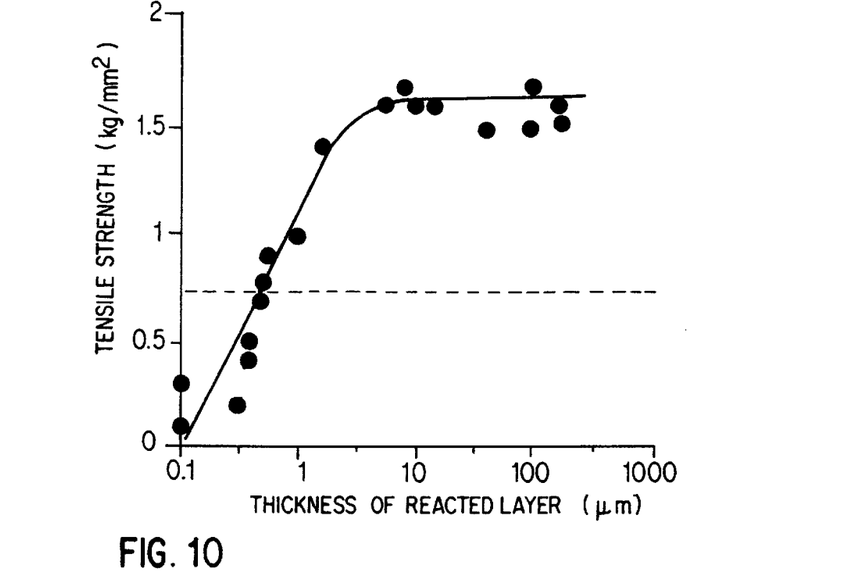
FIG. 10 is a characteristic diagram illustrating the tensile strength of a reacted layer as a function of its thickness.

The characteristic diagram of FIG. 10 illustrates the results of an investigation about a relationship between the average thickness of the reacted layer 15 and the tensile strength between the sintered semiconductor layer 13 and the metal layer 14. As is evident from this diagram, the tensile strength increases with the thickness of the reacted layer 15. It is therefore understood that the thickness of the reacted layer 15 directly affects the tensile strength. If the thickness of the reacted layer 15 is smaller than 0.5 µm, the formation of the reacted layer 15 is insufficient so that the tensile strength does not reach 0.7 Kg/mm$^2$ and moreover, the tensile strength tends to have scattered values. A thickness of the reacted layer 15 greater than 0.5 µm leads to desired tensile strength of 0.7 Kg/mm$^2$ or higher and moreover, the tensile strength does not scatter substantially.

Figure 11:
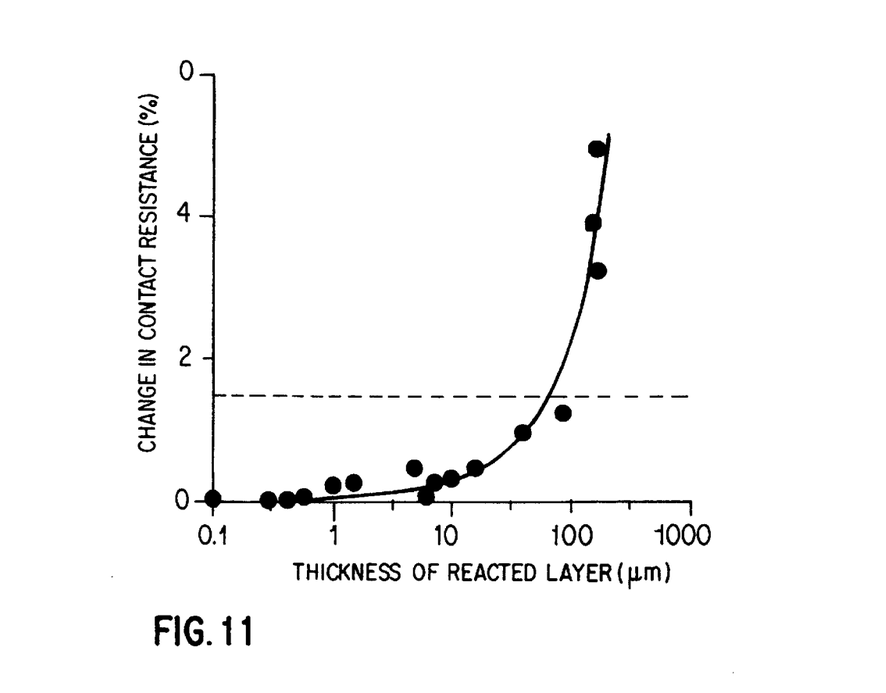
FIG. 11 is a characteristic diagram illustrating the contact resistance of a reacted layer as a function of its thickness.

The characteristic diagram of FIG. 11 depicts the results of an investigation about a relationship between the average thickness of the reacted layer 15 and the change (%) in contact resistance. As is clearly envisaged from this diagram, the change (%) in contact resistance increases with the thickness of the reacted layer 15. It is therefore understood that the thickness of the reacted layer 15 directly affects the change (%) in contact resistance. When the thickness of the reacted layer 15 exceeds 100 µm, the change (%) in contact resistance becomes extremely high so that the performance of thermoelectric conversion is adversely affected. The change (%) in contact resistance can however be controlled within 2% insofar as the thickness of the reacted layer 15 is up to 100 µm.

As is evident from the results shown in FIGS. 10 and 11, control of the average thickness of the reacted layer 15 within a range of from 0.5 to 100 µm, preferably within a range of from 1 to 50 µm makes it possible to obtain high tensile strength and also to control the change (%) in contact resistance low. Incidentally, the thickness of the reacted layer 15 is controllable, for example, by adjusting the presintering thickness of the surface treatment layer 2 and sintering conditions (for example, the pressing force, the pulsating voltage, the application time of the pulsating voltage).

As examples of the above-described metal sheets, 200-µm thick sheets made of copper, aluminum, nickel, iron and titanium, respectively, were used. Nickel plating is applied to one side of each metal sheet. With respect to each metal, the metal sheets were arranged on opposite end faces of a semiconductor powder layer, followed by sintering. An investigation was then conducted to determine the coefficient of expansion, the moduli of elasticity, the existence or non-existence of cracks in the sintered semiconductor layer and the existence or non-existence of separation between the sintered semiconductor layer and the metal layers. The results of the investigation are summarized below in Table 1.

TABLE 1

| Material of metal sheet | Coefficient of expansion ($\times 10^{-6}/°$ C.) | Modulus of elasticity (Kgf/mm$^2$) | Existence or non-existence of cracks and separation |
| --- | --- | --- | --- |
| Copper | 18 | 11,000 | None |
| Aluminum | 23 | 7,000 | None |
| Nickel | 13 | 20,000 | Separated |
| Iron | 12 | 20,000 | Cracked, separated |
| Titanium | 9 | 11,000 | Cracked, separated |

Since semiconductors have coefficients of expansion in a range of from $17\times10^{-6}$/° C. to $18\times10^{-6}$/° C., use of sheets composed of a metal having a coefficient of expansion smaller than the above range develops tensile stress in the vicinity of joined portions of a sintered semiconductor layer when the metal sheets and the sintered semiconductor layer are cooled together after sintering. As a consequence, cracks and/or separation take place. Especially in the case of titanium, there is a substantial difference in coefficient of expansion between the metal sheets and the sintered semiconductor layer (the coefficient of expansion of titanium is about ½ of that of the sintered semiconductor layer), so that significant cracks and separation take place.

On the other hand, in the case of copper or aluminum the coefficient of expansion of which is substantially equal to or greater than that of a semiconductor, compression stress is applied in the vicinity of joined portions of a sintered semiconductor layer after sintering. The sintered semiconductor layer is hence brought into a state clamped between metal layers, so that neither cracks nor separation take place. Particularly in the case of aluminum, its modulus of elasticity is smaller than those of other metals. Aluminum is therefore considered to act advantageously. Usable examples of the material of the metal sheets include, in addition to copper and aluminum, copper alloys with aluminum added in appropriate proportions to copper as a base material and aluminum alloys with copper added in suitable proportions to aluminum as a base material.

The function of the surface treatment layer arranged on a surface of each metal sheet differs depending on whether the metal sheet is made of copper or a copper alloy or is made of aluminum or an aluminum alloy. Described specifically, when copper is a base material, a reaction takes place when the base material is brought into direct contact with a semiconductor material. This leads to a reduction in thermoelectric conversion characteristics. It is therefore necessary to arrange the surface treatment layer between the resulting metal layer and the semiconductor material so that the reaction between the metal layer and the semiconductor material is inhibited. When aluminum is a base material, on the other hand, the surfaces of the metal sheet are prone to oxidation. It is therefore necessary to protect one of the surfaces with the surface treatment layer for the prevention of oxidation until sintering. When an aluminum sheet, for example, of 0.2 to 0.3 mm in thickness is used, the aluminum sheet is subjected to etching treatment or is mechanically polished until its thickness is reduced to 0.1 to 0.15 mm, whereby oxide films are removed from its surfaces. A surface treatment layer is thereafter formed on one of the surfaces.

The surface treatment layer undergoes a diffusion reaction with the semiconductor material so that the resulting diffusion reaction product is required to be stable thermally. A variety of metal materials were studied. As a result, it has been found that, because reaction products with Ni—Te, Sn—Te, Ti—Te, Fe—Te, Sb—Te, Cr—Te and Mo—Te have high melting points and high thermal stability, at least one element selected from the group consisting of Ni, Sn, Ti, Fe, Sb, Cr and Mo is suited as a material for the surface treatment layer whereas Pb, Bi, Te, Pb—Sn eutectic alloys and the like develop substantial changes in characteristics and are therefore not preferred. It has also been found that Bi and Te permit joining with suppressed changes in characteristics insofar as the surface treatment layer is 1 µm or less in thickness.

An investigation was conducted about the thickness of the surface treatment layer. It is desired to limit the thickness of the surface treatment layer to 20 µm or less, preferably to 5 to 10 µm because a thickness greater than 20 µm leads to lower bonding strength with the associated metal layer and also to higher fabrication cost.

Figure 12:
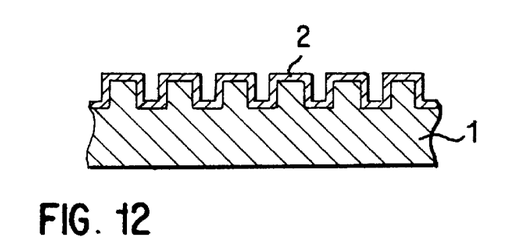
FIG. 12 is a cross-sectional view showing a modification of the metal sheet.

The modification of the metal sheet 1 is illustrated in FIG. 12. In this modification, fine ruggedness is mechanically or chemically formed in a surface of a metal sheet 1. A surface treatment layer 2 is applied to the rugged surface so that after sintering, enhanced joining strength can be obtained between a metal layer 14 and a surface treatment layer 12.

When sintering a semiconductor powder layer at a thickness necessary to use the resulting sintered compact as a thermoelectric semiconductor by arranging metal sheets on opposite sides of the semiconductor powder layer as in this embodiment, the thermoelectric semiconductor is desired to have good thermoelectric conversion characteristics in the direction of its thickness. Incidentally, a Bi—Te system semiconductor material has cleavage so that it is formed into flake-shaped flat particles when a mechanical grinding method is used. When this flake-shaped semiconductor material is charged into a die, the individual particles are filled in a state stacked one over the other within the die. When the semiconductor material is sintered, the crystals are oriented with good characteristics in a direction perpendicular to a pressing direction during the sintering (namely, in the direction of the thickness of the thermoelectric semiconductor) so that thermoelectric conversion characteristics in the direction of the thickness of the thermoelectric semiconductor are not good. To use the above-mentioned characteristics in the perpendicular direction, the sintered compact, subsequent to the completion of the sintering, is cut in a direction perpendicular to the pressing direction during the sintering. This is however accompanied by the problem that diced chips have machining- and/or processing-modified layers and are lowered in characteristics.

Semiconductor particles prepared by the above-mentioned quenching process is composed of plate-shaped particles (width: about 5–10 mm, length: about 10–30 mm, thickness: about 10–40 μm) with their crystallographic a-axes substantially oriented in the direction of the thickness or is composed of spherical or like particles having low orientation. These particles can provide a semiconductor improved in characteristics over that available from mechanically ground powder.

A figure of merit (Z) and tensile strength of each of various semiconductor chips in the pressing direction during sintering are summarized below in Table 2. The individual semiconductor chips in the table are of the following constructions.

Semiconductor chip A: A semiconductor chip obtained by simultaneously sintering plate-shaped particles, which had been prepared by the quenching process, and metal sheets together (an embodiment of the present invention).

Semiconductor chip B: A semiconductor chip obtained by simultaneously sintering spherical particles, which had been prepared by the quenching process, and metal sheets together (an embodiment of the present invention).

Semiconductor chip C: A semiconductor chip obtained by sintering plate-shaped particles, which had been prepared by the quenching process, and then applying Ni plating to opposite end faces of the sintered compact.

Semiconductor chip D: A semiconductor chip obtained by sintering spherical particles, which had been prepared by the quenching process, and then applying Ni plating to opposite end faces of the sintered compact.

Semiconductor chip E: A semiconductor chip obtained by sintering particles, which had been prepared by mechanical grinding, and then applying Ni plating to opposite end faces of the sintered compact.

TABLE 2

| Semiconductor chip | Figure of merit, $Z(10^{-3}/K)$ | | Tensile strength $(Kgf/mm^2)$ |
|---|---|---|---|
| | P-type | N-type | |
| A | 3.1–3.2 | 2.5–2.6 | 1.5–1.8 |
| B | 3.0–3.1 | 2.2–2.3 | 1.2–1.5 |
| C | 3.0–3.1 | 2.4–2.5 | 0.3–1.0 |
| D | 2.9–3.0 | 2.0–2.3 | 0.3–1.0 |
| E | 2.9–3.0 | 1.8–2.1 | 0.3–1.0 |

As is evident from the above table, the semiconductor chips according to the embodiments of the present invention are excellent in both figure of merit (Z) and tensile strength.

Figure 13:
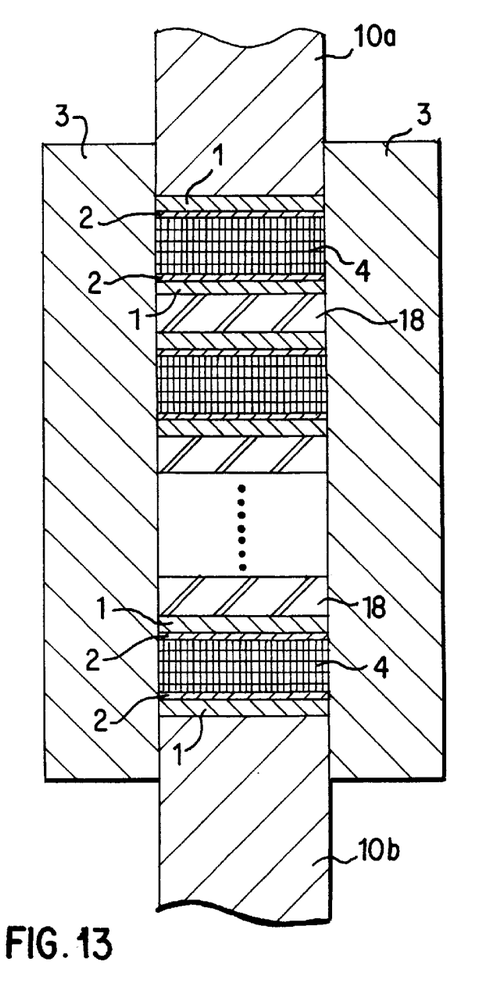
FIG. 13 is a cross-sectional view depicting a modification of the sintering method, for the fabrication of thermoelectric semiconductors.

With reference to FIG. 13, the modification of the sintering method will now be described. According to this modification, a metal sheet 1 with a surface treatment layer 2 formed thereon is placed on a lower plunger 10b within a die 3. A semiconductor powder layer 4 is filled on the surface treatment layer 2, and another metal sheet 1 with a surface treatment layer 2 formed thereon is placed on the semiconductor powder layer 4 to complete a first-stage stacked unit. A spacer 18 is placed on the first-stage stacked unit, and another stacked unit composed of metal sheets 1,1 and a semiconductor power layer 4 is placed on the spacer 18. A plurality (for example, 6 to 8 pairs) of stacked units are filled with the spacers 18 interposed therebetween in the above-described manner and are then subjected to electrical discharge sintering under predetermined pressure and voltage.

As the material for the spacers, an electrical conductor such as graphite, a super-hard alloy, iron or steel can be used. In this modification, the die 3, the upper and lower plungers 10a, 10b and the spacers 18 were all made of graphite. The suitable thickness of the spacers 18 is from 1 to 5 mm. A thickness smaller than 1 mm cannot provide the spacers with sufficient mechanical strength so that the spacers may broken or a current may locally concentrate during use, resulting in uneven sintering. A thickness greater than 5 mm makes it difficult to control the temperatures of the plural stacked units evenly and also reduces the number of stacked units sinterable at the same time, thereby making it difficult to exhibit the merits of electrical discharge sintering.

The sintered compact obtained by the process of FIG. 3 or FIG. 13 has the same thickness as semiconductor chips as an application form of the sintered compact. Accordingly, the sintered compact is diced into predetermined sizes to obtain the semiconductor chips, and an upper and lower end faces of each of the semiconductor chips are joined to electrodes with a solder.

Figure 14:
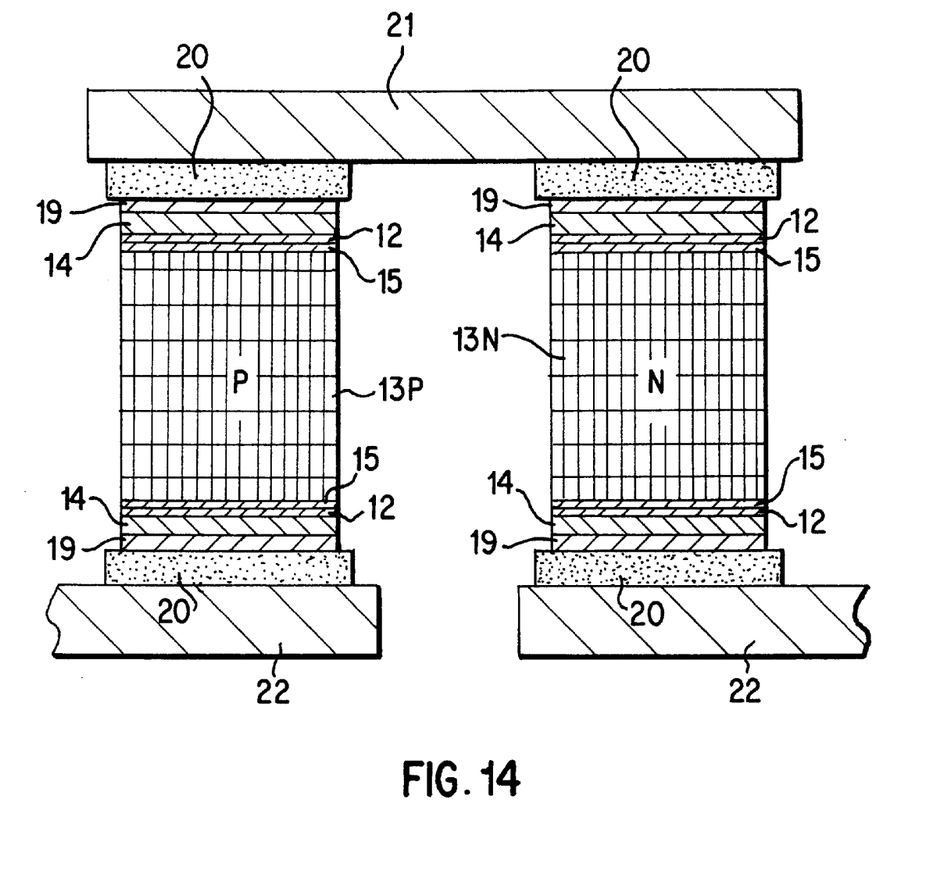
FIG. 14 is a cross-sectional view of a thermoelectric semiconductor device.

The cross-sectional view of FIG. 14 illustrates the thermoelectric semiconductor device fabricated as described above, in which there are shown surface treatment layers 12, a p-type, sintered semiconductor layer 13P, an n-type, sintered semiconductor layer 13N, metal layers 14, reacted layers 15, nickel plating layers 19, solder layers 20, an upper electrode 21, and lower electrodes 22.

ADVANTAGES OF THE INVENTION

As has been described above, a metal layer is interposed between a sintered layer of a semiconductor material and an electrode-joining material in the present invention. A reaction between the semiconductor material and the electrode-joining material is therefore inhibited, thereby making it possible to reduce lowering in characteristics.

Further, the sintered layer of the semiconductor layer and the metal layer are integrally sintered so that the state of joining therebetween is good. Moreover, the semiconductor has extremely high mechanical strength owing to the powder sintering. The semiconductor is therefore provided with improved reliability.

Opposite end faces of the sintered semiconductor layer, at which said sintered semiconductor layer is joined to electrodes, are covered and protected by the metal layers, respectively. As the sintered semiconductor layer is joined to the electrodes via the metal layers without cutting out a semiconductor layer or applying blast treatment, machining- and/or processing-modified layers or the like are not formed on the sintered semiconductor layer, thereby making it possible to reduce lowering in characteristics.

Furthermore, when a molten semiconductor material is quenched, small plate-shaped semiconductor particles are formed by way of a ribbon or the like and the semiconductor particles are filled between the metal sheets, most of the semiconductor particles are necessarily brought into a state where they are stacked one over the other in layers. Most of the semiconductor particles are therefore oriented with their a-axes directed in a direction perpendicular to the metal sheets, that is, towards the electrodes (namely, in a direction of a current fed across the semiconductor layer), whereby a semiconductor layer having a high figure of merit (Z) can be obtained.

When the metal layers have a coefficient of expansion greater than that of the sintered semiconductor layer as described in the claims, compression stress is applied to the sintered semiconductor layer after the sintering of the semiconductor powder layer and the metal layers. Cracking and/or separation of the sintered semiconductor layer can therefore be prevented.

When a surface treatment layer is interposed between the sintered semiconductor layer and each metal layer as described in formation of an oxide can be prevented even where the metal layer is composed of a metal susceptible to oxidation such as aluminum, thereby making it possible to prevent inclusion of an oxide between the metal layer and the sintered semiconductor layer. In addition, where the metal layer is composed of a metal reactive with the semiconductor material, such as copper, the reaction can be inhibited by the surface treatment layer.

As described herein, each surface treatment layer may be composed of at least one metal selected from the group consisting of Ni, Sn, Ti, Fe, Sb, Bi, Cr, Te and Mo. In this case, even if a portion of the surface treatment layer reacts with the semiconductor material, the reaction product is thermally stable so that no substantial change takes place in characteristics.

When joined surfaces of each metal layer and its associated surface treatment layer are in finely rugged forms as described herein, high joining strength is obtained.

When a reacted layer of the surface treatment material and the semiconductor material is interposed between the surface treatment layer and the sintered semiconductor layer as described herein, high joining strength can obtained by the reacted layer.

By restricting the average thickness of each reacted layer to a range of from 0.5 to 100 $\mu$m as described herein, high joining strength and low change (%) in contact resistance can be obtained.

When joined surfaces of each surface treatment layer and its associated reacted layer and joined surfaces of each reacted layer and the sintered semiconductor layer are in finely rugged forms as described herein, high joining strength can be obtained at the associated joined surfaces.

When two or more pairs of metal sheets, each pair of metal sheets having a semiconductor power layer arranged therebetween, are stacked one over the other with a spacer interposed therebetween and are then pressed and sintered concurrently as described herein, improved productivity can be achieved.

What is claimed is:

1. A fabrication process of a thermoelectric semiconductor, which comprises the following steps:

quenching a molten semiconductor material to obtain plate-shaped semiconductor particles with a-axes thereof oriented in directions of thicknesses thereof;

filling said semiconductor particles between metal sheets such that said axes of said semiconductor particles extend perpendicularly to planes in which said metal sheets lie, respectively;

compressing said semiconductor particles in a direction perpendicular to said planes such that a semiconductor powder layer is formed between said metal sheets;

sintering said semiconductor powder layer and said metal sheets integrally, whereby metal layers obtained from said metal sheets are joined on opposite end faces of a sintered, semiconductor layer obtained from said semiconductor powder layer, respectively; and joining, with an electrode-joining material, said sintered semiconductor layer to electrodes via said metal layers, respectively wherein said metal layers comprise an inhibiting material for inhibiting a reaction between said sintered semiconductor layer and said electrode-joining material.

2. A fabrication process according to claim 1, wherein said metal sheets are composed of a metal selected from the group consisting of aluminum and aluminum alloys.

3. A fabrication process of a plurality of pairs of thermal electric semiconductors, wherein the fabrication process of each of said plurality of pairs comprises the following steps:

guenching a molten semiconductor material to obtain plate-shaped semiconductor particles with a-axes thereof oriented in directions of thicknesses thereof;

filling said semiconductor particles between metal sheets such that said axes of said semiconductor particles extend perpendicularly to planes in which said metal sheets lie, respectively;

compressing said semiconductor particles in a direction perpendicular to said planes such that a semiconductor powder layer is formed between said metal sheets;

sintering said semiconductor powder layer and said metal sheets integrally, whereby metal layers obtained from said metal sheets are joined on opposite end faces of a sintered, semiconductor layer obtained from said semiconductor powder layer, respectively, joining, with an electrode-joining material, said sintered semiconductor layer to electrodes via said metal layers, respectively, wherein said plurality of pairs are stacked one over the other with a spacer interposed therebetween, and are then pressed and sintered concurrently.

* * * * *